(12) United States Patent
Uetani et al.

(10) Patent No.: US 6,383,709 B2
(45) Date of Patent: May 7, 2002

(54) POSITIVE RESIST COMPOSITION COMPRISING N-(N-OCTYLSULFONYLOXY) SUCCINIMIDE

(75) Inventors: Yasunori Uetani, Toyonaka; Jun Tomioka, Osaka, both of (JP); Sang-Ho Lee, Suwon-shi (KR)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/812,583

(22) Filed: Mar. 21, 2001

(30) Foreign Application Priority Data

Mar. 23, 2000 (JP) .......................................... 2000-081599

(51) Int. Cl.⁷ ............................................... G03F 7/023

(52) U.S. Cl. ....................... 430/191; 430/165; 430/192; 430/193

(58) Field of Search ................................. 430/191, 192, 430/193, 165

(56) References Cited

FOREIGN PATENT DOCUMENTS

| EP | 0875787 A1 | 11/1998 |
|---|---|---|
| JP | 10-213905 | 8/1998 |

*Primary Examiner*—John S. Chu
(74) *Attorney, Agent, or Firm*—Birch, Stewart, Kolasch & Birch, LLP

(57) ABSTRACT

A positive resist composition which gives improved profile without lowering other properties such as sensitivity and resolution, and comprises an alkali-soluble novolak resin, a quinone diazide type radiation-sensitive agent and N-(n-octylsulfonyloxy)succinimide

9 Claims, No Drawings

US 6,383,709 B2

POSITIVE RESIST COMPOSITION COMPRISING N-(N-OCTYLSULFONYLOXY) SUCCINIMIDE

BACKGROUND OF THE INVENTION

The present invention relates to a positive resist composition used in providing resist patterns through irradiation of rays such as ultra violet rays followed by alkaline development and in producing semiconductor integrated circuits and the like.

In a positive resist containing a novolak resin as an alkaline-soluble component and a quinone diazide compound as a radiation-sensitive component, the quinone diazide compound decomposes by irradiation of a ray to produce carboxyl group and turns from alkaline-insoluble to alkaline-soluble innature. This phenomenon is utilized for providing a positive type pattern by irradiation of the ray through a mask (the so-called patterning exposure) followed by alkaline development in an alkaline medium. The above described positive resist containing a novolak/quinone diazide is generally excellent in resolution, and is widely used in the manufacture of integrated circuits.

In recent years, the integrated circuit has become micronized as the degree of integration increases and the formation of submicron patterns is required. As a result, the positive resist with higher resolution and excellent patterning capability (profile) is required. When circuit pattern becomes finer the top surface tends to be rounded or the slant between the top and bottom tends to be conspicuous. As a result, it becomes more difficult to reflect faithfully the mask pattern on the resist pattern to be formed during pattern exposure. Therefore, apositive resist composition is desired which solves those problems and gives a good profile.

The inventors of the present invention have conducted intensive studies to develop a positive resist composition which gives a good profile. As a result, the inventors have found that a positive resist containing an acid generating agent, such as sulfonate of N-hydroxy succinimide, which decomposes to give an acid in an alkaline developer provides an excellent profile, and have disclosed it(JP-A-10-213905, SPIE Vol. 3333, 1280P–1287P, 1998).

After conducting further studies, the inventors have found that a positive resist composition containing a specific composition among sulfonates of N-hydroxy succinimide, namely N-(n-octylsulfonyloxy)succinimide, gives a specifically excellent profile. Thus, the present invention was completed.

SUMMARY OF THE INVENTION

The present invention provides a positive resist composition comprising an alkali-soluble novolak resin, a quinone diazide type radiation-sensitive agent and N-(n-octylsulfonyloxy)succinimide.

DESCRIPTION OF THE PREFERRED EMBODIMENTS

An alkali-soluble novolak resin generally used as an alkaline-soluble component of a known positive resist can also be used as the alkali-soluble novolak resin used in the present invention. The alkali-soluble novolak resin used in the present invention can generally be made by condensing a phenolic compound and an aldehyde in the presence of an acid catalyst. Examples of the phenolic compound include phenol, o-, m- or p-cresol, 2,3-, 2,5-, 3,4- or 3,5-xylenol, 2,3,5-trimethylphenol, 2-, 3- or 4-tert-butyphenol, 2-tert-butyl- 4- or 5-methylphenol, 2-, 4- or 5-methyl resorcinol, 2-, 3- or 4- methoxyphenol, 2,3-, 2,5- or 3,5-dimethoxyphenol, 2-methoxyresorcinol, 4-tert-butyl catechol, 2-, 3- or 4-ethylphenol, 2,5- or 3,5 -diethylphenol, 2,3,5-triethylphenol, 2-naphthol, 1,3-, 1,5- or 1,7-dihydroxylnaphthalene and polyhydroxytriphenyl methane type compounds obtained by condensing xylenol and hydroxybenzaldehyde. These phenolic compounds can be used alone or in combination of two or more.

Examples of the aldeyede include aliphatic aldehyedes such as formaldehyde, acetoaldehyde, propyonaldehyde, n-butylaldehyde, isobutylaldehyde, pivalic aldehyde, n-hexylaldehyde, acrolein- and crotonaldehyde; alicyclic compounds such as cyclohexyaldehyde, cyclopentanaldehyde, furfural and furylacrolein; aromatic aldehydes such as benzaldehyde, o-, m- or p-methylbenzaldehyde, p-ethylbenzaldehyde, 2,4-, 2,5-, 3,4- or 3,5-dimethylbenzaldehyde, o-, m- or p-hydroxybenzaldehyde, o-,m- or p-anisic aldehyde and vanillin; and aromoaliphic aldehydes such as phenyl acetaldehyde, and cinnamic aldehyde. These aldehydes can also be used alone or in combination of two or more. Among them, formaldehyde is preferable because it is readily available in the industry.

Examples of the acid catalysts usable in condensing the phenolic compound and aldehyde include inorganic acids such as hydrochloric acid, sulfuric acid, perchloric acid andphosphoric acid; organic acids such as formic acid, acetic acid, oxalic acid, trichloroacetic acid and p-toluenesulfonic acid; bivalent metallic salts such as zinc acetate, zinc chloride and magnesium acetate. Those acid catalysts can be used alone or in combination of two or more. The condensation reaction can be carried out in a usual way, for example, for 2 to 30 hours at 60 to 120° C.

A novolak resin obtained by the condensation is preferably subjected to a fractionation to increase high molecular weight component. It is preferable that, when expressed in a gel permeation chromatography (GPC) pattern, the pattern area of the components with a molecular weight not higher than 1000 is not higher than 25%, more preferably not higher than 20%, based on the total pattern area except for the unreacted phenolic compounds. Here, the GPC pattern is measured using a 254 nm UV detector, and the molecular weight is in terms of the molecular weight of polystyrene.

It is useful to add a low molecular weight alkali-soluble phenol compound, for example the one with a molecular weight of not higher than 1,000, to the novolak resin in which the high molecular weight component was increased. Such alkali-soluble low molecular weight phenol compounds have preferably at least two phenolic hydroxyl groups as disclosed in JP-A-2-275955 (U.S. Pat. Nos. 5,456, 995 and 5,456,996) and JP-A-2-2560. In case an alkali-soluble phenol compound with a molecular weight of not higher than 1,000 is used, it is desirable that the compound is present in 3 to 40 percent by weight based on the total amount of the novolak resin and the alkali-soluble phenol compound.

A quinone diazo-type radiation-sensitive agent generally used in the positive resist field can be used as the quinone diazo-type radiation-sensitive agent used in the present invention. Generally, an o-quinone diazosulfonic acid ester of a compound having one or more phenolic hydroxyl groups can be used. Preferable are 1,2-naphthoquinonediazo-5- or 4-sulfonic acid ester or 1,2-benzoquinone diazo-4-sulfonic acid ester of polyhydroxy compounds having at least three phenol hydroxyl groups.

Such esters can be made by reacting the compounds having the aforesaid hydroxyl groups with o-quinone diazosulfonic acid halide in the presence of a base such as triethyl amine. Among O-quinone diazosulfonic acid halides, 1,2-naphthoquinone diazo-5-sulfonic acid chloride is especially preferable. Such quinone diazo-type radiation-sensitive agents can be used alone as combination of one or two agents. It is preferable that the radiation-sensitive agent is present in 10 to 100 percent by weight, more preferably 10 to 50 percent by weight based on the total amount of the novolak resin and the aforesaid low molecular weight alkali-soluble phenol compound used as necessary.

The positive resist composition of the present invention comprises N-(n-octylsulfonyloxy)succinimide in addition to the alkali-soluble novolak resin and the quinone diazo-type radiation-sensitive agent mentioned above. This compound can be prepared by condensation of N-hydroxy succinimide with n-octylsulfonyl chloride under basic medium.

The content of N-(n-octylsulfonyloxy)succinimide is generally 0.01 to 25 percent by weight, preferably 0.1 to 10 percent by weight based on the total solid content in the composition.

The positive resist composition of the present invention is generally applied as a resist solution on a substrate such as silicon wafer. That is, the above-mentioned respective components are dissolved in a solvent to prepare a resist solution and this solution is applied. Any solvents may be used which dissolve the respective components, have a proper drying rate and give a uniform and smooth coat. The solvents which are generally used in this field may be used. Example thereof include glycol ether esters such as ethyl cellosolve acetate, methyl cellosolve acetate, propylene glycol monomethyl ether acetate and propyleneglycol monoethyl ether acetate; glycol ethers such as ethyl cellusolve, methyl cellusolve, propylene glycol monomethyl ether and propylene glycol monoethyl ether; esters such as ethyl lactate, butyl acetate, amyl acetate and ethyl pyruvate; ketones such as 2-heptanone and cyclohexanone; and cyclic esters such as γ-butyrolactone. Those solvents can be used alone or in combination of two or more. Also, this resist solution can contain small quantities of additives such as other resins than novolak resin and dyestuffs used in this field.

The resist solution applied on the substrate and dried to form a resist film is subjected to a patterning exposure through a mask. This patterning exposure is generally effected by visible rays of shorter wavelengths to near ultraviolet rays such as g line of a wavelength of 436 nm and i line with a wavelength of 365 nm. The patterning exposure is followed by development in an alkaline developer. As the alkaline developer, a variety of alkaline solutions employed in this field may be used. Generally, tetramethyl ammonium hydroxide and (2-hydroxy ethyl) trimethyl ammonium hydroxide (generally called choline) are used in the form of an aqueous solution.

The present invention will now be described in more specifically by means of Examples, which by no means should be construed as a limitation upon the scope of the present invention. In Examples, parts mean parts by weight.

The following materials were used in examples:
(a) Novolak Resin A

The resin was prepared this way: m-cresol, p-cresol and formaldehyde at a molar ratio of 60/40/80 were reacted under reflux in the presence of oxalic acid catalyst in the usual method. Then, the reaction product was subjected to a fractionation. The novolak resin thus obtained had a molecular weight of about 8000 in terms of polystyrene. In GPC pattern, the area ratio of the area for the components with a molecular weight of not higher than 6000 in terms of polystyrene to the total pattern area except for the pattern area of unreacted cresol was 34% and the area ratio of the area for the components with a molecular weight of not higher than 1000 in terms of polystyrene was 15%.
(b) Novolak Resin B The resin prepared this way: m-cresol, p-cresol and formaldehyde at a molar ratio of 40/60/80 were reacted under reflux in the presence of oxalic acid catalyst in the usual method. Then, the reaction product was subjected to a fractionation. The novolak resin thus obtained had a molecular weight of about 8000 in terms of polystyrene. In GPC pattern, the area ratio of the area for the components with a molecular weight of not higher than 6000 in terms of polystyrene to the total pattern area except for the pattern area for unreacted cresol was 34% and the area ratio of the area for the components with a molecular weight of not higher than 1000 in terms of polystyrene was 15%.
(c) Quinone Diazo-type Sensitizer

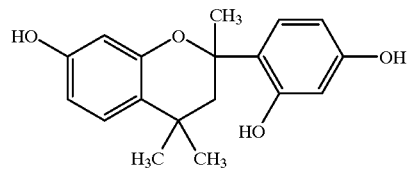

A condensate having a structural formula shown above was used which was prepared by reacting 2,4,4-trimethyl-2',4',7-trihydroxyflavan and 1,2-naphthoquinone diazide-5-sulfonic acid chloride at molar ratio of 1:2.6.
(d) Additives
The following compounds were used:
C1: N-(n-octylsulfonyloxy)succinimide
C2: N-(n-hexylsufonyloxy)succinimide
C3: N-(10-camphorsulfonyloxy)succinimide
C4: N-(n-dodecylsulfonyloxy)succinimide
C5: 4-[1',2',3',4' 4'a,9'a -hexahydro-6'-hydroxyspiro (cyclohexane-1,9'-xantene)-4'a-il]-resorcinol
Those additives have the following structural formulas:

(C1)

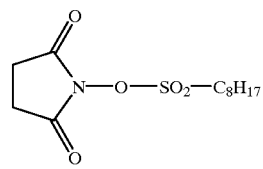

(C2)

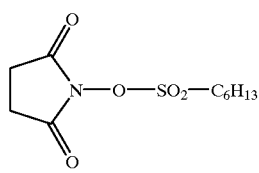

(C3)

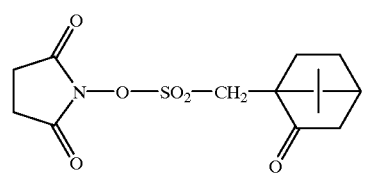

-continued

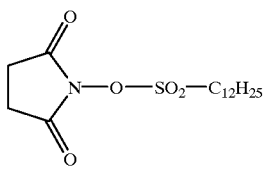
(C4)

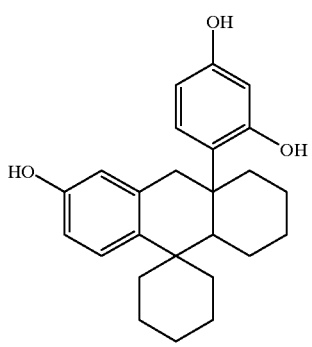
(C5)

EXAMPLES 1 to 3 AND COMPARATIVE EXAMPLES 1 to 4

10 parts of the above-mentioned resins, the ratio of the novolac resin A and B being shown in Table 1, 3 parts of the above-mentioned sensitizer and a composition of additives, their kinds and amounts being shown in Table 1, were mixed with 46 parts of 2-heptanone. After the mixture was completely dissolved, the solution was filtered through a 0.2 μm fluororesin filter to prepare a resist solution.

TABLE 1

| No. | Resin | Additive | |
|---|---|---|---|
| Example 1 | A/B = 85/15 | C1 = 0.1 part | C5 = 3.9 part |
| Example 2 | A/B = 85/15 | C1 = 0.2 part | C5 = 3.8 part |
| Example 2 | A/B = 90/10 | C1 = 0.2 part | C5 = 3.8 part |
| Comparative example 1 | A/B = 85/15 | — | C5 = 4.0 part |
| Comparative example 2 | A/B = 85/15 | C2 = 0.2 part | C5 = 3.8 part |
| Comparative example 3 | A/B = 85/15 | C3 = 0.2 part | C5 = 3.8 part |
| Comparative example 4 | A/B = 85/15 | C4 = 0.2 part | C5 = 3.8 part |

The respective resist solutions thus obtained were spin-coated on silicon wafers treated with hexamethyldisilazane (HMDS) so that the film thickness after drying was 1.065 μm. The pre-bake was carried out on a direct hot plate for 60 seconds at 90° C. The wafers with a resist film thus formed thereon were exposed to light through line and space patterns of various sizes by changing the amount of exposure stepwise using an i- line stepper "NSR-2005 i 9C" (NA= 0.57, σ=0.60) manufactured by Nikon. Then, post-exposure bake was performed for 60 seconds at 110° C., followed by paddle development in an aqueous solution of 2.38 % by weight of tetramethyl ammonium hydroxide for 60 seconds. The evaluation results are shown in Table 2.

Effective Sensibility

Expressed by an amount of exposure which gives a sectional area of 1:1 in 1.0 μm line and space pattern.

Resolution

Expressed by the minimum line width of line and space pattern splitting by the amount of exposure at the effective sensibility.

Profile (T/B)

Expressed by the ratio of the size at the top (T) of 1.0 μm line and space pattern to the size of at the bottom (B). The larger T/B is, the better the profile is.

TABLE 2

| No. | Effective sensibility (msec) | Resolution (μm) | T/B |
|---|---|---|---|
| Example 1 | 55 | 0.50 | 0.75 |
| Example 2 | 65 | 0.475 | 0.89 |
| Example 3 | 55 | 0.50 | 0.78 |
| comparative example 1 | 50 | 0.50 | 0.67 |
| comparative example 2 | 55 | 0.50 | 0.71 |
| comparative example 3 | 50 | 0.50 | 0.72 |
| comparative example 4 | 75 | 0.475 | 0.71 |

According to the present invention, it has become possible to improve the profile without lowering other properties such as sensitivity and resolution.

What is claimed is:

1. A positive resist composition comprising an alkali-soluble novolak resin, a quinone diazide radiation-sensitive agent and N-(n-octylsulfonyloxy)succinimide.

2. The positive resist composition according to claim 1 wherein the content of N-(n-octylsulfonyloxy)succinimide is 0.01 to 25 percent by weight based on the total solid content in the composition.

3. The positive resist composition according to claim 1 wherein the content of N-(n-octylsulfonyloxy)succinimide is 0.1 to 10 percent by weight based on the total solid content in the composition.

4. The positive resist composition according to claim 1 wherein, when expressed in a gel permeation chromatography (GPC) pattern, the pattern area of the components of the alkali-soluble novolak resin with a molecular weight not higher than 1000 is not higher than 25% based on the total pattern area of the alkali-soluble novolak resin except for the unreacted phenolic compounds.

5. The positive resist composition according to claim 4 which further comprises a low molecular weight alkali-soluble phenol compound with a molecular weight of not higher than 1,000 at 3 to 40 percent by weight based on the total amount of the novolak resin and the low molecular weight alkali-soluble phenol compound.

6. The positive resist composition according to claim 1 wherein the radiation-sensitive agent is present in 10 to 100 percent by weight based on the amount of the novolak resin.

7. The positive resist composition according to claim 5 wherein the radiation-sensitive agent is present in 10 to 100 percent by weight based on the total amount of the novolak resin and the low molecular weight alkali-soluble phenol compound.

8. The positive resist composition according to claim 1 wherein the radiation-sensitive agent is present in 10 to 50 percent by weight based on the amount of the novolak resin.

9. The positive resist composition according to claim 5 wherein the radiation-sensitive agent is present in 10 to 50 percent by weight based on the total amount of the novolak resin and the low molecular weight alkali-soluble phenol compound.

* * * * *